United States Patent [19]

Uratsuji

[11] Patent Number: 5,685,725
[45] Date of Patent: Nov. 11, 1997

[54] IC SOCKET

[75] Inventor: Kazumi Uratsuji, Tokyo, Japan

[73] Assignee: Yamaichi Electronics Co., Ltd., Tokyo, Japan

[21] Appl. No.: 608,032

[22] Filed: Feb. 28, 1996

Related U.S. Application Data

[63] Continuation of Ser. No. 172,175, Dec. 23, 1993, abandoned.

[30] Foreign Application Priority Data

Dec. 25, 1992 [JP] Japan .................. 4-358430

[51] Int. Cl.$^6$ .................................................. H01R 9/09
[52] U.S. Cl. ........................................ 439/71; 439/482
[58] Field of Search .................. 439/70-71, 266, 439/269.1, 269.2, 482, 757, 758, 762

[56] References Cited

U.S. PATENT DOCUMENTS

| | | | |
|---|---|---|---|
| 4,272,143 | 6/1981 | Weiss | 439/266 |
| 4,331,371 | 5/1982 | Ichimura | 439/266 |
| 4,468,072 | 8/1984 | Sadigh-Belzadi | 439/266 |
| 4,773,877 | 9/1988 | Kruger et al. | 439/482 |
| 4,963,822 | 10/1990 | Prokopp | 324/758 |
| 5,045,780 | 9/1991 | Swart | 439/482 X |
| 5,114,358 | 5/1992 | Myers | 439/70 |
| 5,247,250 | 9/1993 | Rios | 439/70 |
| 5,419,710 | 5/1995 | Pfaff | 439/266 |

FOREIGN PATENT DOCUMENTS

| | | | |
|---|---|---|---|
| 0283545 | 9/1988 | European Pat. Off. | 324/757 |
| 0152961 | 8/1985 | Japan | 324/758 |
| 4098844 | 3/1992 | Japan | 324/757 |
| 4110667 | 4/1992 | Japan | 324/757 |

*Primary Examiner*—Khiem Nguyen
*Attorney, Agent, or Firm*—Wenderoth, Lind & Ponack

[57] ABSTRACT

An IC socket is equipped with a plurality of elastic contact pins which are brought into contact with spherical bumps of an IC package. Each of the contact pins has at a foremost end thereof a contacting portion disposed opposite to a lower spherical surface of the spherical bump. The contacting portion has a relief portion which is kept in a non-contacting condition relative to a lower dead point portion on the lower spherical surface of the spherical bump, and a contacting end is brought into press contact at an area thereof around the relief portion with that area of the spherical surface of the spherical bump outwardly adjacent to the lower dead point.

19 Claims, 6 Drawing Sheets

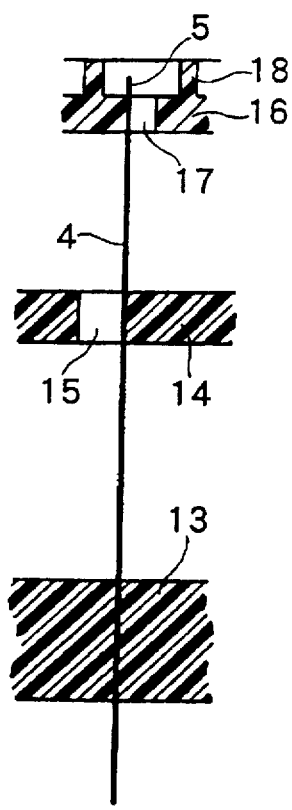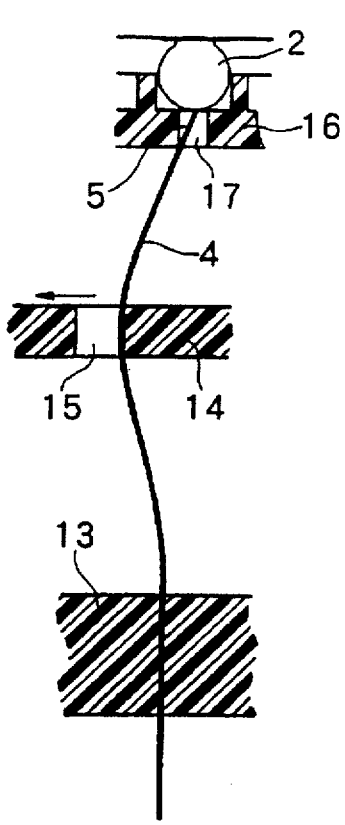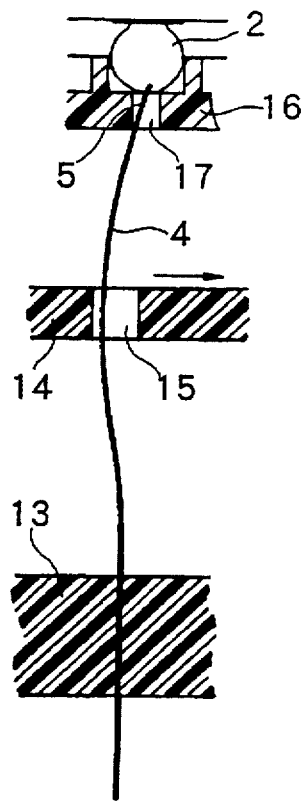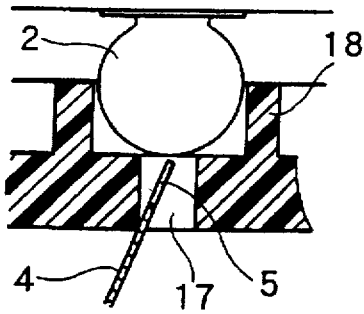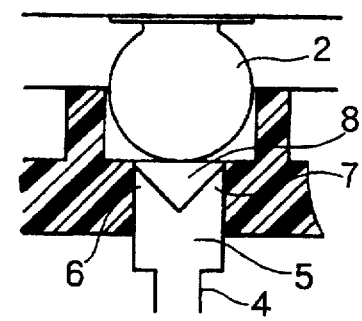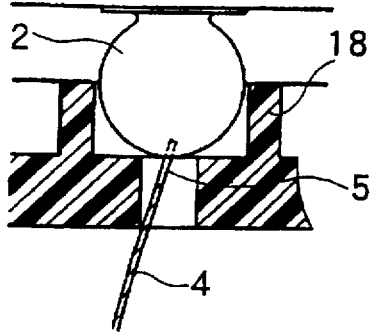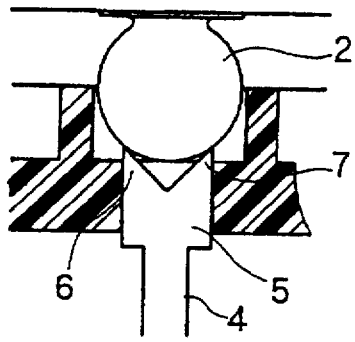

IC SOCKET

This application is a continuation of now abandoned application, Ser. No. 08/172,175, filed on Dec. 23, 1993.

BACKGROUND OF THE INVENTION

1. Field of the Invention

This invention relates to a socket used for an IC package having a spherical bump.

2. Prior Art

As shown in FIGS. 10 through 13, there is known an IC package of the type in which a number of spherical bumps are formed on a lower surface of an IC package body 1.

Each of the spherical bumps 2 is either semi-spherical as shown in FIG. 10 or spherical as shown in FIG. 11. They are formed of metal having a low melting point such as soldering material. In many cases, there is employed a method of use in which the spherical bumps are directly mounted on a wiring board and welded to a wiring pattern.

As shown in FIG. 13, in a socket for the use in an aging test of the IC package, there is employed a method in which a spring probe 3 held by the socket is moved forwardly and backwardly in a vertical direction relative to the spherical bump 2 to bring a tip of the spring probe 3 into contact with the bump 2 under pressure. As a result, it is unavoidable for this method that the tip of the spring probe 3 is brought into contact with a lower dead point of the spherical bump 2 under pressure.

However, the following problems are inherent in the above socket. A lower dead point of the spherical bump 2, which is directly welded to the wiring board, is easily damaged by the probe 3, and the tip of the spring probe 3 of the socket tends to slip sideways on the surface of the lower dead point portion of the spherical bump 2, thereby resulting in a poor contacting condition.

In addition, there is another problem in that with a structure having only one contacting spot, it is difficult to realize a reliable contacting condition.

SUMMARY OF THE INVENTION

It is therefore an object of the present invention to provide an IC socket which assures reliable contact with an IC package having spherical bumps.

In order to achieve the above object, there is provided an IC socket equipped with a plurality of elastic contact pins which are brought into contact with spherical bumps of an IC package, each of the contact pins having at a foremost end thereof a contacting portion disposed opposite to a lower spherical surface of the spherical bump, the contacting portion having a relief portion which is kept in a non-contracting condition relative to a lower dead point portion in the lower spherical surface of the spherical bump and also a contacting end which is brought into press contact at an area thereof around the relief portion with that area of the spherical surface of the spherical bump outwardly adjacent to the lower dead point.

BRIEF DESCRIPTION OF THE DRAWINGS

FIGS. 6(A)–6(C) show cross-sectional views of the socket, with FIG. 6(A) showing a socket without an IC package loaded thereon, FIG. 6(B) showing a socket with an IC package loaded thereon and in which the contacting condition between a contact pin and a spherical bump is released, and FIG. 6(C) showing a socket with an IC package loaded thereon and in which a contact pin is in contact with a spherical bump;

FIGS. 7(A) and 7(B) show enlarged side and front cross-sectional views of a spherical bump and a contact pin, in contact in released conditions, respectively;

FIGS. 8(A) and 8(B) show enlarged side and front cross-sectional views similar to FIGS. 7(A) and 7(B), but in contacting conditions, respectively;

DETAILED DESCRIPTION OF THE INVENTION

Preferred embodiments of the present invention will be described in detail with reference to FIGS. 1 through 9.

Figure 1:
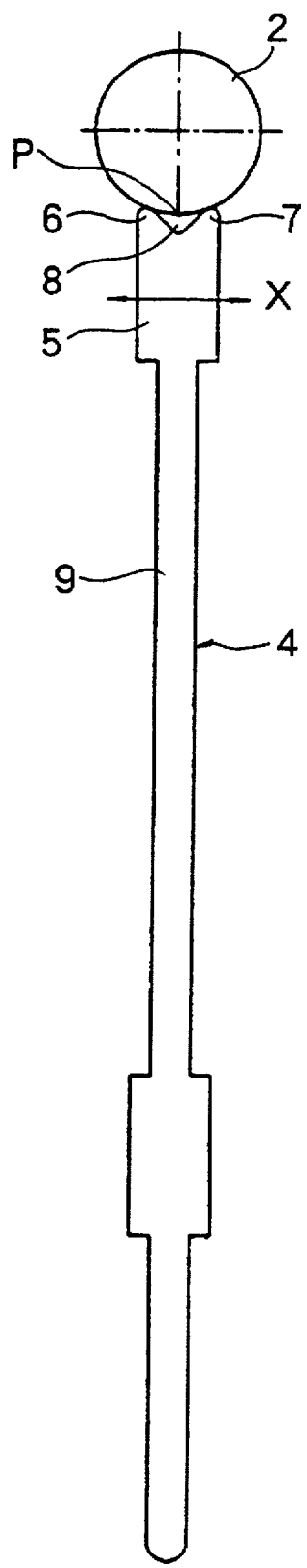
FIG. 1 is a side view showing one example of a contacting structure between a spherical bump and an elastic contact pin.

In FIG. 1, reference numeral 4 denotes an elastic contact pin held by a socket. This elastic contact pin 4 is formed of a single elongated sheet plate having elasticity. This sheet plate has at a foremost end thereof a contacting portion 5 disposed opposite to a lower spherical surface of a spherical bump (electrical lead) 2.

This contacting portion is bifurcated generally in a U-shape or V-shape to define a first contacting free end 6 and a second contacting free end 7, and a relief portion 8 is defined by a recessed portion formed between the first and second contacting ends 6 and 7. The contacting portion 5 is spaced apart, in a non-contacting condition, at the relief portion 8 from a lower dead point portion of the spherical surface of the spherical bump 2, and is in point-contact at two spots of the distal ends of the first and second contacting ends 6 and 7 on the opposite sides of the relief portion 8 with that area of the spherical bump 2 outwardly adjacent to the lower dead point portion. The first and second contacting ends 6 and 7 are in a symmetrical relation with respect to a lower dead point P of the spherical bump 2 and are brought into contact, in an elastically pressed condition, with the spherical surface of the spherical bump 2 at the spots equidistant from the lower dead point P.

Figure 4:
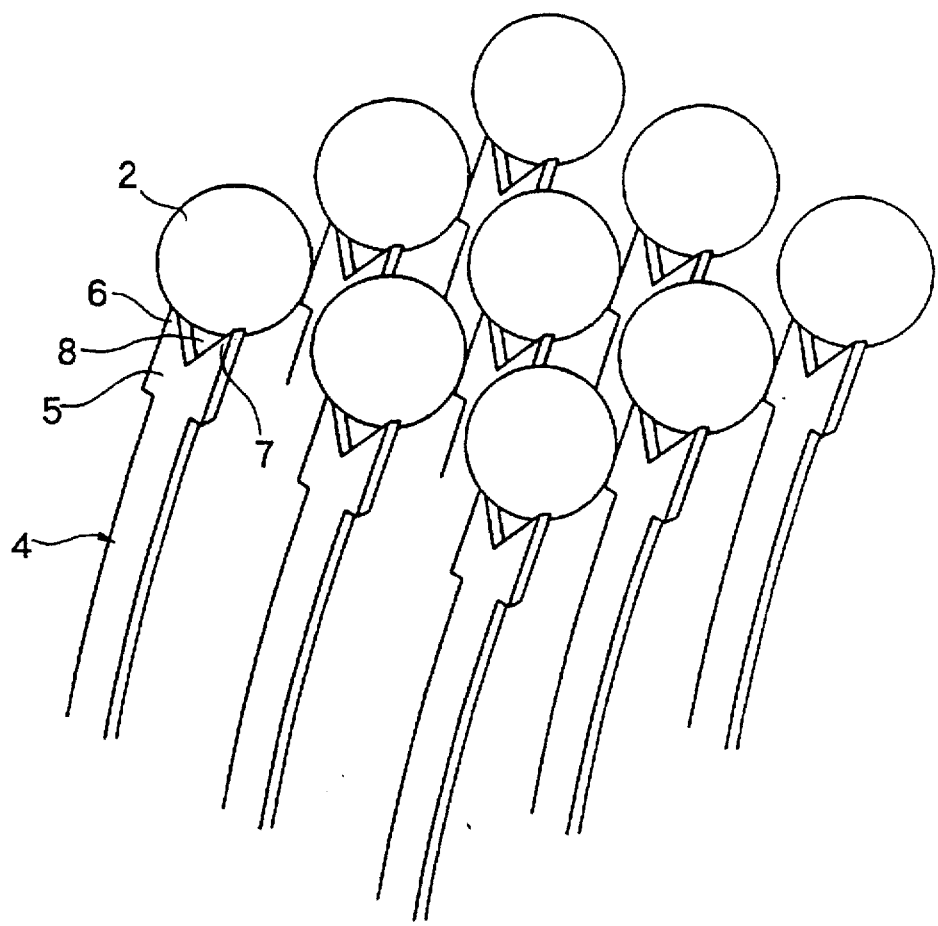
FIG. 4 is a perspective view showing a number of elastic contact pins of a socket in press contact with a number of spherical bumps.
Figure 5:
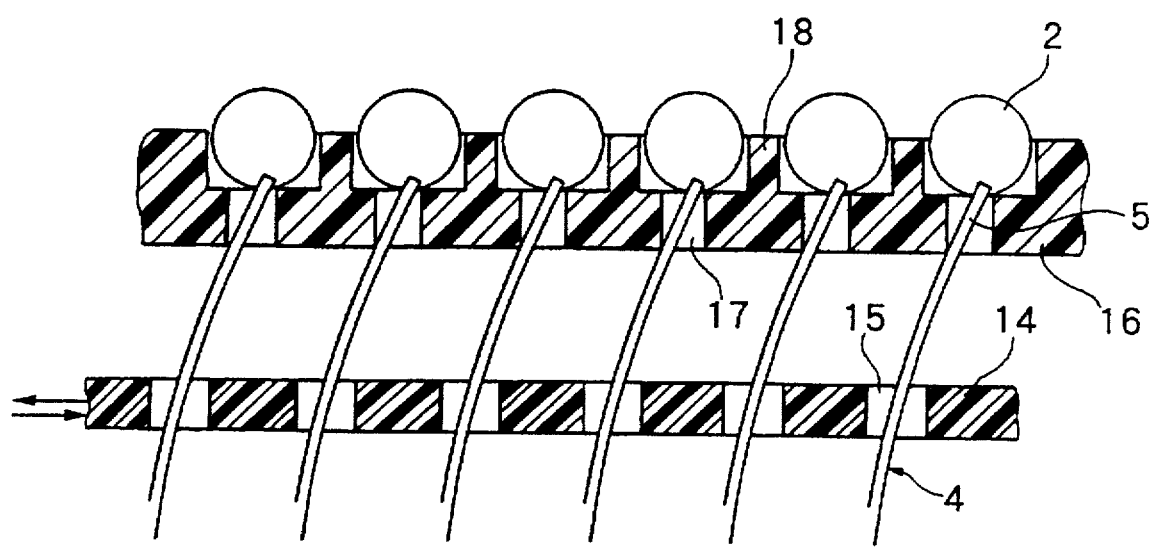
FIG. 5 is a cross-sectional view of the socket.

To realize this press-contacting condition, the elongated sheet plate portion supporting the contacting portion 5 defines a spring element 9. As shown in FIGS. 4 to 6, this spring piece 9 is capable of deflecting in a direction perpendicular to a line, which connects the first and second contacting ends 6 and 7 together to accumulate resilient force and be brought into press-contact with the spherical bump 2.

The reason why the spring piece 9 must deflect in the direction perpendicular to the above-mentioned line is as follows. If it is designed such that the spring piece 9 is capable of deflecting in the direction of the line which connects the first and second contacting ends 6 and 7 (that is, the direction in the sense of an arrow X of FIG. 1), there is a possibility that either of the first and second contacting ends 6 and 7 moves across and causes a damage to the lower dead point portion of the spherical bump 2. Therefore, in this invention, the spring piece 9 is designed so as to be in capable of deflecting in the X direction.

Figure 2:
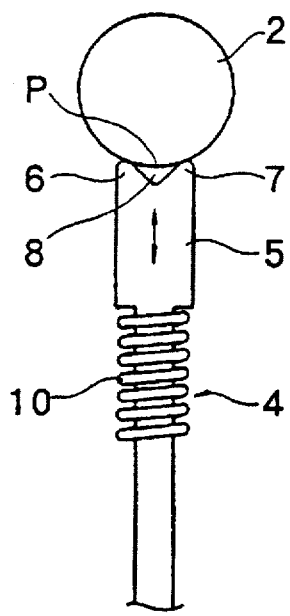
FIG. 2 is a side view showing another example of a contacting structure between a spherical bump and an elastic contact pin.
Figure 3A:
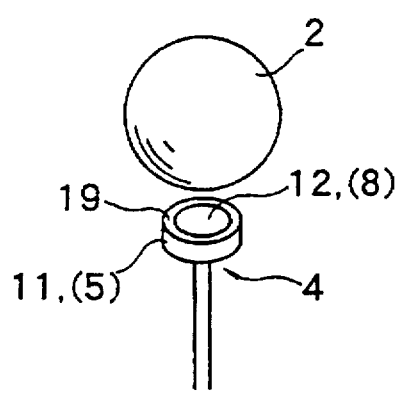
FIGS. 3(A) and 3(B) show a further example of a contacting structure between a spherical bump and an elastic contact pin, with FIG. 3(A) being a perspective view, FIG. 3(B) being a vertical cross-sectional view, and FIG. 3(C) being a transverse cross-sectional view.
Figure 3B:
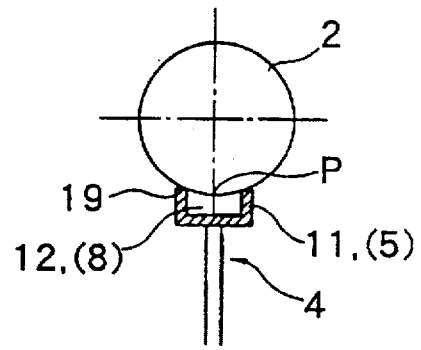
Figure 3C:
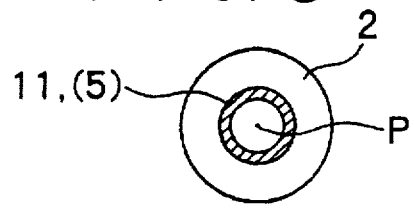

In the example of FIG. 2, the elastic contact pin 4 is moved in a direction normal to the lower dead point P of the spherical bump 2 in order to realize and release the contacting condition. The contact pin 4 is biased upwardly by a coil spring 10 along the above-mentioned vertical line. By doing this, the first and second contacting ends 6 and 7 are brought into press-contact with two spots of that area of the spherical surface outwardly adjacent to the lower dead point portion of the spherical bump 2, and the contact pin is kept in a non-contacting condition relative to the lower dead point portion owing to the provision of the relief portion 8.

The elastic contact pin 4 may be called a spring probe. In the example shown in FIGS. 3(A) through 3(C), the contact pin 4 is brought into press-contact with that area of the spherical surface of the spherical bump 2 outwardly adjacent to the lower dead point portion in an annularly contacting condition.

As illustrated, the contacting portion of the foremost end of the elastic contact pin 4 is formed of a cylindrical sleeve member 11. An end face of this sleeve member 11 is disposed opposite to the lower spherical surface of the spherical bump 2, and a central opening 12 thereof defines the relief portion 8 so that, at the central opening 12,the contacting portion is kept in a non-contacting condition relative to the lower dead point portion of the spherical bump 2. An end face 19 of a wall defining a cylindrical hole in the sleeve member 11 defines the contacting end. This contacting end is brought into press-contact with that area of the spherical surface of the spherical bump 2 outwardly adjacent to the lower dead point portion in an annularly contacting condition.

The elastic contact pin 4 of FIG. 3 is brought into press-contact with the spherical bump 2 in the manner as shown in FIGS. 1 and 5, as well as elsewhere, or otherwise the contact pin 4 is resiliently held by the coil spring 10 such that the contact pin is moved in a direction normal to the lower dead point P of the spherical bump 2 in the manner as shown in FIG. 2.

FIGS. 4 through 8 show a socket equipped with a means for moving the elastic contact pin 4 of FIG. 1 into contact with and away from the spherical bump 2.

A number of contact pins 4 are arranged on the socket base 13 extend upwardly. Each of the contact pins 4 is formed of an elongated one-piece sheet of an electrically conductive material. The contact pins 4 are pierced all the way into through-holes 15, which are formed in a laterally movable operating plate 14, and then the foremost ends of the contact pins 4 thus pierced through the holes 15 are received in through-holes 17 which are formed in a damping plate 16. This damping plate 16 is rigidly integrally formed with the socket base 13, and the above-mentioned operating plate 14 is laterally movably disposed between the socket base 13 and the damping plate 16. The contact pins 4 are loosely disposed in both of the through-holes 15 and 17.

As shown in FIG. 6(A), the contact pin 4 is upstanding. In that condition, when the operating plate 14 is laterally moved in one direction, the inner wall of the through-hole 15 presses the contact pin 4 as shown in FIG. 6(B). As a result, the foremost end of the contact pin 4 is bent into a curved form while being supported by the inner wall of the through-hole 17 in the damping plate 16 and moved in a contracting direction within the through-hole 17. As a consequence, the foremost end contacting portion 5 of the contact pin 4 is moved brought away from the spherical bump 2, thereby realizing the contact-releasing condition as shown in FIGS. 7(A) and 7(B). The IC package body 1 is loaded on the damping plate 16, and a positioning wall 18 formed in the damping plate 16 is disposed between the spherical bump 2 and the damping plate 16 in order to correctly position the bump 2.

As shown in FIG. 6(C), when the operating plate 14 is laterally moved in the other direction by the restoring force of the contact pin 4 or when the operating plate 14 is laterally moved in the other direction to restore the contact pin 4, the contact pin 4 is stretched so that the foremost end portion 5 of the contact pin 4 is brought into press-contact with the spherical bump 2 either at an opening surface of the through-hole 17 in the damping plate 16 or in a slightly projected manner from the through-hole 17 as shown in FIGS. 8(A) and 8(B). That is, the contact pin 4 is caused to accumulate resilient force by the spring element 9 deflecting in a direction perpendicular to the line which connects the first and second contacting ends 6 and 7 and is brought into press-contact with the spherical bump 2.

The press-contacting is made at an area around the relief portion 8 as already mentioned.

Figure 9:
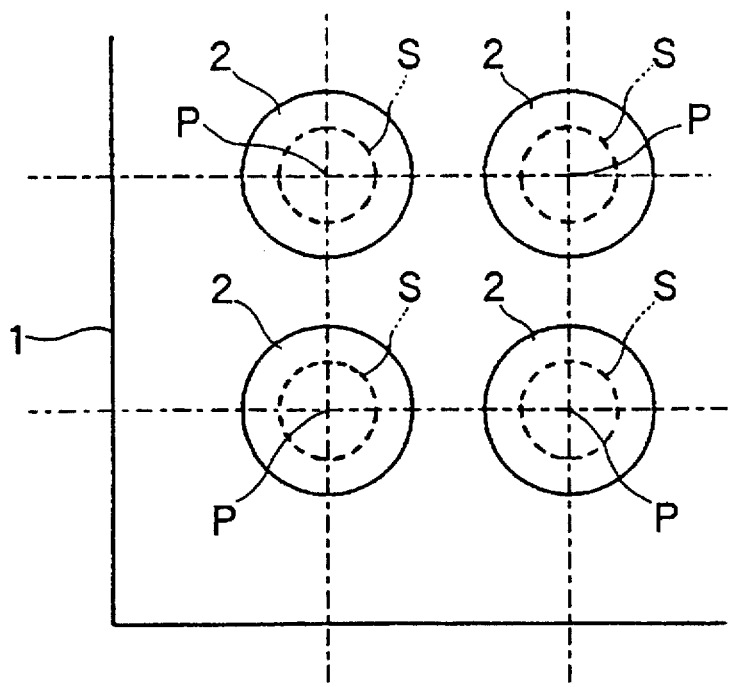
FIG. 9 is a bottom view of an IC package showing a part where spherical bumps and contact pins contact.
Figure 10:
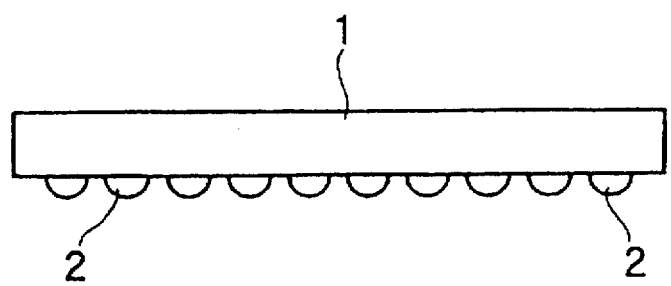
FIG. 10 is a side view of an IC package.
Figure 11:
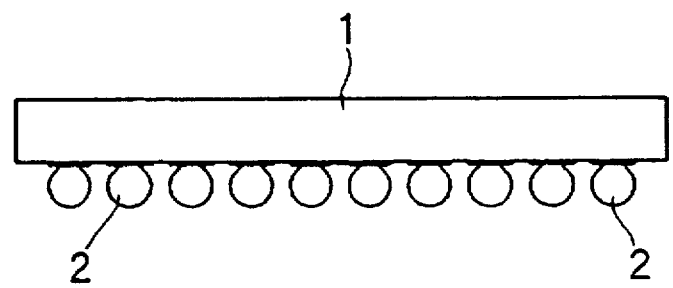
FIG. 11 is a side view showing another example of an IC package.
Figure 12:
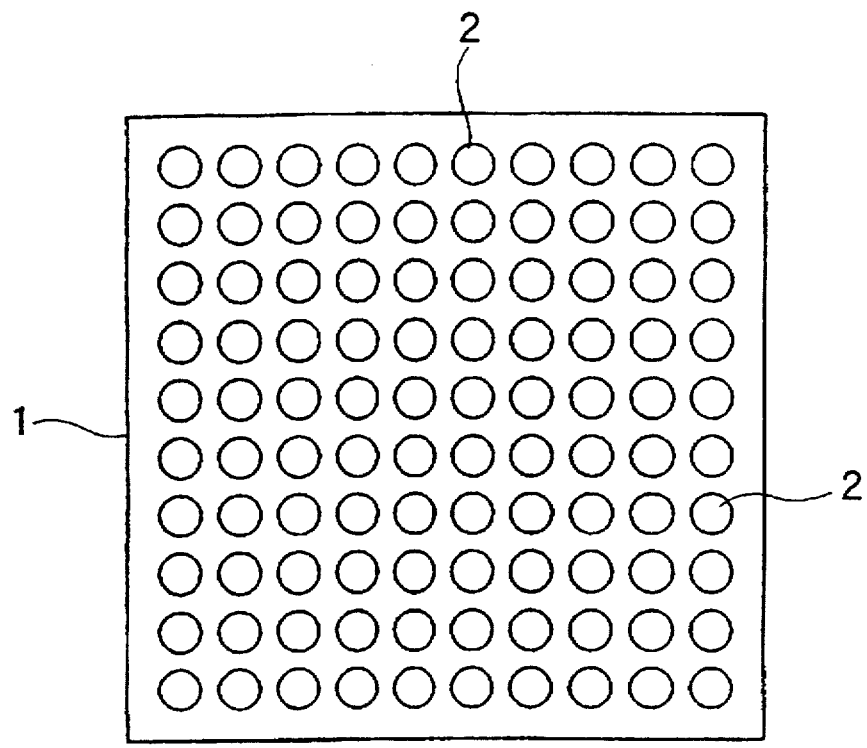
FIG. 12 is a plan view of the above IC package.
Figure 13:
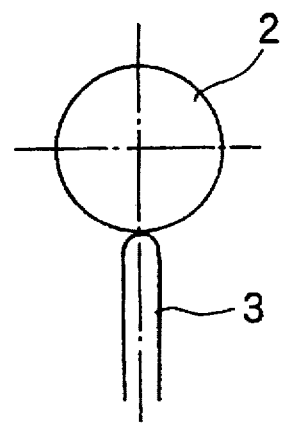
FIG. 13 is a side view showing a contacting condition between a spherical bump and a contact pin according to the prior art.

In FIG. 9, those areas S where the contacting portions 5 of the contact pins 4 are in contact with the spherical bumps 2 are indicated by imaginary lines. As seen from FIG. 9, the contacting ends of the contacting portions 5 are in contact with the spherical surfaces of the bumps 2 on circular orbits around the lower dead points P of the bumps 2, respectively.

According to the present invention, since the contact pin can be brought into contact with the spherical bump 2 at a plurality of contacting spots or in annularly contacting conditions in that area of the spherical bump outwardly adjacent to the lower dead point portion around the relief portion, the problem of damaging the lower dead point portion of the spherical bump can be effectively obviated.

In addition, the contacting portion of the contact pin safely catches the area outwardly adjacent to the lower dead point portion of the spherical bump to positively maintain the press-contacting condition, and therefore a reliable contacting condition can be realized.

Furthermore, since the contacting portion of the contact pin is brought into contact with the spherical bump at a plurality of contacting spots or in an annularly contacting condition, the reliable contacting condition is further enhanced.

The present invention is not limited to the above embodiments, but many changes can be made without departing from the scope of the invention.

What is claimed is:

1. An IC contact assembly including
   a plurality of electrically conductive elastic contact pins, each of said elastic contact pins comprising:
   a base end;

an elongated spring portion extending from said base end; and a planar contacting portion extending from said elongated spring portion, said planar contacting portion having opposite planar faces, laterally opposite side edges and a distal end edge spanning between said laterally opposite side edges;

wherein said contacting portion is generally U-shaped and includes first and second spaced apart and mutually integral coplanar contacting free ends at said laterally opposite side edges, respectively, an entirety of said distal end edge between said first and second contacting free ends constituting a recessed portion formed between said first and second contacting free ends, such that said contacting portion constitutes a means for contacting a spherical electrical lead in such a manner that said first and second contacting free ends come into point contact with the spherical electrical lead at positions equidistantly spaced apart from and on opposing sides of a lower dead point of the spherical electrical lead, and said recessed portion is spaced below the lower dead point of the spherical electrical lead so as to constitute a non-contacting portion.

2. An IC contact assembly as recited in claim 1, further comprising an IC socket base, said base ends of said contact pins being secured to said IC socket base; and coil spring means for biasing said contacting portion of each of said elastic contact pins in a direction normal to the lower dead point of the respective spherical electrical lead to cause said first and second contacting free ends of each of said elastic contact pins to come into point contact with the respective spherical electrical lead at the positions equidistantly spaced apart and on opposing sides of the lower dead point of the spherical electrical lead with said recessed part being spaced below the lower dead point of the spherical electrical lead.

3. An IC contact assembly as recited in claim 1, wherein each of said elastic contact pins constitutes a one-piece elongated sheet plate which is bendable in a first direction transverse to a longitudinal direction thereof and perpendicular to a line extending between said first and second contacting free ends, and which is substantially unbendable in a second direction transverse to the longitudinal direction of said contact pin and parallel to the line extending between said first and second contacting free ends.

4. An IC contact assembly as recited in claim 3, further comprising an IC socket base, said base ends of said contact pins being secured to said IC socket base;

a damping plate mounted to said IC socket base and having a plurality of through-holes in which said contacting portions of said contact pins are respectively disposed; and an operating plate slidably mounted between said damping plate and said IC socket base, said operating plate having a plurality of through-holes through which said spring portions of said contact pins respectively extend.

5. An IC contact assembly as recited in claim 4, wherein said operating plate constitutes a means for bending said contact pins in said first direction to thereby retract said contacting portions of said contact pins into said through-holes of said damping plate and out of contact with the spherical bumps, respectively, and for returning said contact pins to substantially unbent conditions to cause said contacting portions of said contact pins to project through said through-holes of said damping plate and into contact with the spherical bumps.

6. An IC contact assembly as recited in claim 1, further comprising an IC socket base, said base ends of said contact pins being secured to said IC socket base;

a damping plate mounted to said IC socket base and having a plurality of through-holes in which said contacting portions of said contact pins are respectively disposed; and an operating plate slidably mounted between said damping plate and said IC socket base, said operating plate having a plurality of through-holes through which said spring portions of said contact pins respectively extend.

7. An IC contact assembly as recited in claim 6, wherein said operating plate constitutes a means for bending each of said contact pins in a first direction, transverse to a longitudinal direction thereof and perpendicular to a line extending between said first and second contacting ends thereof, to thereby retract said contacting portions of said contact pins into said through-holes of said damping plate and out of contact with the spherical bumps, respectively, and for returning said contact pins to substantially unbent conditions to cause said contacting portions of said contact pins to project through said through-holes of said damping plate and into contact with the spherical bumps.

8. An IC socket as recited in claim 1, further comprising an IC socket base, said base ends of said contact pins being secured to said IC socket base; and an IC package including spherical electrical leads for electrically contacting said contact pins, respectively.

9. An IC socket as recited in claim 8, wherein said spherical electrical leads are formed of a low-melting point material.

10. An IC contact assembly including a plurality of electrically conductive elastic contact pins, each of said elastic contact pins comprising:

a base end;

an elongated spring portion extending from said base end; and a contacting portion extending from said elongated spring portion;

wherein said contacting portion includes a cylindrical wall with an annular end surface for contacting a spherical electrical lead along an annular line, said cylindrical wall constituting a radially outermost portion of said contacting portion, and an entirety of an area located inwardly of said cylindrical wall constituting a recessed portion recessed relative to said cylindrical wall so as to be spaced below a lower dead point of the spherical electrical lead when said annular end surface of said cylindrical wall is in contact with the spherical electrical lead.

11. An IC socket as recited in claim 10, wherein said elongated spring portion of each of said contact pins is flexible in forward, rearward, rightward and leftward directions when viewed in elevation, so as to constitute means for allowing said contacting portion to be moved relative to said base end of each of said contact pins in said forward, rearward, rightward and leftward directions.

12. An IC contact assembly as recited in claim 10, further comprising an IC socket base, said base ends of said contact pins being secured to said IC socket base; and coil spring means for biasing said contacting portion of each of said elastic contact pins in a direction normal to the lower dead point of the respective spherical electrical lead to cause said annular end surface of said cylindrical wall to come into electrical contact with the respective spherical electrical lead along the respective annular line and with the recessed part beings spaced below the lower dead point of the spherical electrical lead.

13. An IC socket as recited in claim 10, further comprising an IC socket base, said base ends of said contact pins being secured to said IC socket base; and an IC package including spherical electrical leads for electrically contacting said contact pins, respectively.

14. An IC socket as recited in claim 13, wherein said spherical electrical leads are formed of a low-melting point material.

15. An IC contact assembly as recited in claim 10, wherein each of said contact pins constitutes a one-piece member.

16. An IC contact assembly as recited in claim 15, further comprising an IC socket base, said base ends of said contact pins being secured to said IC socket base;

a damping plate mounted to said IC socket base and having a plurality of through-holes in which said contacting portions of said contact pins are respectively disposed; and an operating plate slidably mounted between said damping plate and said IC socket base, said operating plate having a plurality of through-holes through which said spring portions of said contact pins respectively extend.

17. An IC contact assembly as recited in claim 16, wherein said operating plate constitutes a means for bending each of said contact pins in a direction transverse to a longitudinal direction thereof to thereby retract said contacting portions of said contact pins into said through-holes of said damping plate and out of contact with the spherical bumps, respectively, and for returning said contact pins to substantially unbent conditions to cause said contacting portions of said contact pins to project through said through-holes of said damping plate and into contact with the spherical bumps.

18. An IC contact assembly as recited in claim 10, further comprising an IC socket base, said base ends of said contact pins being secured to said IC socket base;

a damping plate mounted to said IC socket base and having a plurality of through-holes in which said contacting portions of said contact pins are respectively disposed; and an operating plate slidably mounted between said damping plate and said IC socket base, said operating plate having a plurality of through-holes through which said spring portions of said contact pins respectively extend.

19. An IC contact assembly as recited in claim 18, wherein said operating plate constitutes a means for bending each of said contact pins in a direction transverse to a longitudinal direction thereof to thereby retract said contacting portions of said contact pins into said through-holes of said damping plate and out of contact with the spherical bumps, respectively, and for returning said contact pins to substantially unbent conditions to cause said contacting portions of said contact pins to project through said through-holes of said damping plate and into contact with the spherical bumps.

* * * * *